United States Patent
Law et al.

(10) Patent No.: US 10,163,633 B2
(45) Date of Patent: Dec. 25, 2018

(54) NON-MANDREL CUT FORMATION

(71) Applicant: GLOBALFOUNDRIES Inc., Grand Cayman (KY)

(72) Inventors: Shao Beng Law, Watervliet, NY (US); Xunyuan Zhang, Albany, NY (US); Errol Todd Ryan, Clifton Park, NY (US); Nicholas LiCausi, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/457,200

(22) Filed: Mar. 13, 2017

(65) Prior Publication Data

US 2018/0261457 A1    Sep. 13, 2018

(51) Int. Cl.

| | |
|---|---|
| *H01L 21/768* | (2006.01) |
| *H01L 21/308* | (2006.01) |
| *H01L 21/3065* | (2006.01) |
| *H01L 23/528* | (2006.01) |
| *H01L 21/3205* | (2006.01) |
| *H01L 21/285* | (2006.01) |
| *H01L 21/033* | (2006.01) |

(Continued)

(52) U.S. Cl.
CPC ...... *H01L 21/0337* (2013.01); *H01L 21/0276* (2013.01); *H01L 21/0332* (2013.01); *H01L 21/28556* (2013.01); *H01L 21/3065* (2013.01); *H01L 21/3081* (2013.01); *H01L 21/31116* (2013.01); *H01L 21/31144* (2013.01); *H01L 21/32051* (2013.01); *H01L 21/76802* (2013.01); *H01L 21/76816* (2013.01); *H01L 21/76877* (2013.01); *H01L 23/5283* (2013.01)

(58) Field of Classification Search
None
See application file for complete search history.

(56) References Cited

U.S. PATENT DOCUMENTS

| | | |
|---|---|---|
| 6,380,006 B2 | 4/2002 | Kido |
| 9,281,212 B1 | 3/2016 | Glodde et al. |

(Continued)

FOREIGN PATENT DOCUMENTS

| | | |
|---|---|---|
| TW | 511147 B | 11/2002 |
| TW | 201539538 A | 10/2015 |

(Continued)

OTHER PUBLICATIONS

USPTO, Office Action issued in U.S. Appl. No. 15/359,037 dated Dec. 21, 2017.

(Continued)

*Primary Examiner* — Stephanie P Duclair
(74) *Attorney, Agent, or Firm* — Thompson Hine LLP; Anthony Canale

(57) ABSTRACT

Methods of forming non-mandrel cuts. A dielectric layer is formed on a metal hardmask layer, and a patterned sacrificial layer is formed on the dielectric layer. The dielectric layer is etched to form a non-mandrel cut in the dielectric layer that is vertically aligned with the opening in the patterned sacrificial layer. A metal layer is formed on an area of the metal hardmask layer exposed by the non-mandrel cut in the dielectric layer. The metal hardmask layer is patterned with the metal layer masking the metal hardmask layer over the area.

19 Claims, 3 Drawing Sheets

(51) Int. Cl.
*H01L 21/311* (2006.01)
*H01L 21/027* (2006.01)

(56) References Cited

U.S. PATENT DOCUMENTS

| | | |
|---|---|---|
| 9,368,350 B1 | 6/2016 | He et al. |
| 9,478,462 B1 | 10/2016 | Wang et al. |
| 9,778,561 B2 | 10/2017 | Marks et al. |
| 2007/0020928 A1 | 1/2007 | Albertson et al. |
| 2007/0170574 A1 | 7/2007 | Lauxtermann et al. |
| 2008/0032508 A1* | 2/2008 | Chang ............... G03F 7/0035 438/725 |
| 2011/0117723 A1 | 5/2011 | Seidel et al. |
| 2012/0282779 A1* | 11/2012 | Arnold ............... H01L 21/0337 438/703 |
| 2014/0148012 A1 | 5/2014 | Guillorn et al. |
| 2014/0315380 A1* | 10/2014 | Kanakasabapathy ........................ H01L 21/76802 438/618 |
| 2015/0048430 A1 | 2/2015 | He et al. |
| 2015/0243518 A1 | 8/2015 | deVilliers |
| 2016/0042969 A1 | 2/2016 | Mohanty |
| 2017/0018499 A1 | 1/2017 | Chen et al. |
| 2017/0287727 A1 | 10/2017 | Kikuchi et al. |

FOREIGN PATENT DOCUMENTS

| | | |
|---|---|---|
| TW | 201618186 A | 5/2016 |
| TW | 201624562 A | 7/2016 |

OTHER PUBLICATIONS

USPTO, Office Action issued in U.S. Appl. No. 15/360,255 dated Jul. 3, 2017.
Shao Beng Law et al., U.S. Appl. No. 15/359,037, filed Nov. 22, 2016 entitled Self-Aligned Lithographic Patterning.
Shao Beng Law et al., U.S. Appl. No. 15/360,255, filed Nov. 23, 2016 entitled Post Spacer Self-Aligned Cuts.
USPTO, final Office Action issued in U.S. Appl. No. 15/360,255 dated Jan. 11, 2018.
USPTO, Office Action issued in U.S. Appl. No. 15/359,037 dated Jun. 29, 2017.
Taiwan Intellectual Property Office, Examination Report issued in Taiwan Patent Application No. 107101261 and English translation thereof dated Aug. 13, 2018.
USPTO, Notice of Allowance issued in U.S. Appl. No. 15/360,255 dated May 18, 2018.
USPTO, Notice of Allowance issued in U.S. Appl. No. 15/359,037 dated May 21, 2018.

\* cited by examiner

NON-MANDREL CUT FORMATION

BACKGROUND

The present invention relates to integrated circuits and semiconductor device fabrication and, more specifically, to methods for forming non-mandrel cuts.

A back-end-of-line (BEOL) interconnect structure may be used to connect device structures fabricated on a substrate during front-end-of-line (FEOL) processing. The metallization levels of a BEOL interconnect structure may be formed using a damascene process. In a dual damascene process, via openings and trenches are formed in a dielectric layer and simultaneously filled with metal to create a metallization level. In a single-damascene process, the via openings and trench are separately formed and filled with metal.

Self-aligned patterning processes involve the use of mandrels as sacrificial structures to set a feature pitch. Sidewall spacers, which have a thickness less than that permitted by the current ground rules for optical lithography, are formed on the vertical sidewalls of the mandrels. After selective removal of the mandrels, the sidewall spacers are used as an etch mask to etch an underlying hardmask and dielectric layer, for example, with a directional reactive ion etch (RIE) process.

Cuts may be formed in mandrels with a cut mask and etching in order to section the mandrels and define gaps that subsequently are used to form adjacent wires that are spaced apart at their tips with a tip-to-tip spacing. A pattern reflecting the cut mandrels is transferred to a hardmask, which is used in turn to pattern a dielectric layer. Non-mandrel cuts may also be formed in the hardmask itself and filled by spacer material when the sidewall spacers are formed on the mandrels. These non-mandrel cuts are also transferred to the hardmask and subsequently from the hardmask to the patterned dielectric layer.

Improved methods of forming non-mandrel cuts are needed.

SUMMARY

In an embodiment of the invention, a method includes forming a dielectric layer on a metal hardmask layer and forming a patterned sacrificial layer on the dielectric layer. The dielectric layer is etched to form a non-mandrel cut in the dielectric layer that is vertically aligned with the opening in the patterned sacrificial layer. A metal layer is formed on an area of the metal hardmask layer exposed by the non-mandrel cut in the dielectric layer. The metal hardmask layer is patterned with the metal layer masking the metal hardmask layer over the area.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
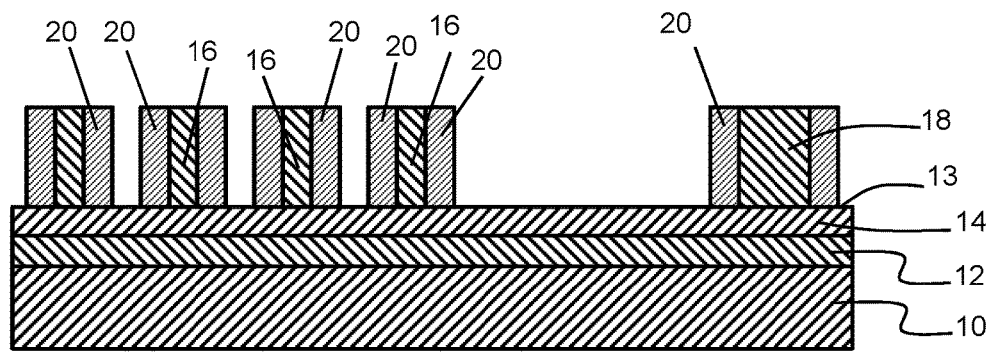
FIGS. 1-4 are cross-sectional views of a structure at successive fabrication stages of a processing method in accordance with embodiments of the invention.

With reference to FIG. 1 and in accordance with embodiments of the invention, a dielectric layer 10 is processed according to the processing method to form an interconnect structure of a metallization level. The dielectric layer 10 may be composed of an electrically-insulating dielectric material, such as hydrogen-enriched silicon oxycarbide (SiCOH) produced from an octamethylcyclotetrasiloxane (OMCTS) precursor or another type of low-k dielectric material. The dielectric layer 10 may be located on a substrate comprised of, for example, a semiconductor material suitable for forming an integrated circuit and including device structures fabricated by front-end-of-line (FEOL) processing to form the integrated circuit.

A hardmask layer 12 is located on the top surface of the dielectric layer 10. The hardmask layer 12 may be comprised of a metal, such as titanium nitride (TiN), deposited by physical vapor deposition (PVD). The hardmask layer 12 is removable from the dielectric layer 10 selective to the material the dielectric layer 10.

A dielectric layer 14 is formed on the hardmask layer 12. The dielectric layer 14 may be composed of a dielectric material, such as silicon nitride ($Si_3N_4$), deposited by chemical vapor deposition (CVD). The dielectric layer 14 is removable from the hardmask layer 12 selective to the material of associated the hardmask layer 12. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

Mandrels 16, 18 are formed on a top surface 13 of the dielectric layer 14. The mandrels 16, 18 may be concurrently formed by depositing a blanket layer of a material on the entire top surface of the dielectric layer 14 and patterning the blanket layer by lithography and etching using a lithography stack. For example, a sidewall image transfer (SIT) process or self-aligned double patterning (SADP) process may be used to pattern the mandrels 16, 18. The dimensions of mandrel 18 may be greater than the dimensions of mandrels 16. The mandrels 16, 18 may be composed of silicon, such as amorphous silicon, deposited at a low temperature by CVD.

Sidewall spacers 20 are formed at locations on the top surface 13 of the dielectric layer 14 adjacent to the vertical sidewalls of the mandrels 16 and at locations on the top surface 13 of the dielectric layer 14 adjacent to the vertical sidewalls of the mandrel 18. The sidewall spacers 20 and the mandrels 16, 18 are arranged lengthwise in parallel rows on the top surface 13 of the dielectric layer 14.

The sidewall spacers 20 may be formed by depositing a conformal layer comprised of a dielectric material, such as silicon dioxide ($SiO_2$), on the mandrels 16, 18 and the top surface of dielectric layer 14 where exposed by the mandrels 16, 18, and shaping the conformal layer with an anisotropic etching process, such as reactive ion etching (ME). The anisotropic etching process preferentially removes the dielectric material from horizontal surfaces, such as the top surfaces of the dielectric layer 14 and the mandrels 16, 18 in deference to the dielectric material remaining as sidewall spacers 20. The material constituting the sidewall spacers 20 may be chosen to be removed by a given etch chemistry selective to the material of the mandrels 16, 18. The sidewall spacers 20 may be comprised of a dielectric material, such as silicon dioxide ($SiO_2$) deposited by atomic layer deposition (ALD), and mandrels 16, 18 comprised of silicon may be removed selective to silicon dioxide comprising the spacers 20 so that the mandrels 16, 18 can be pulled without removing the spacers 20.

Figure 2:
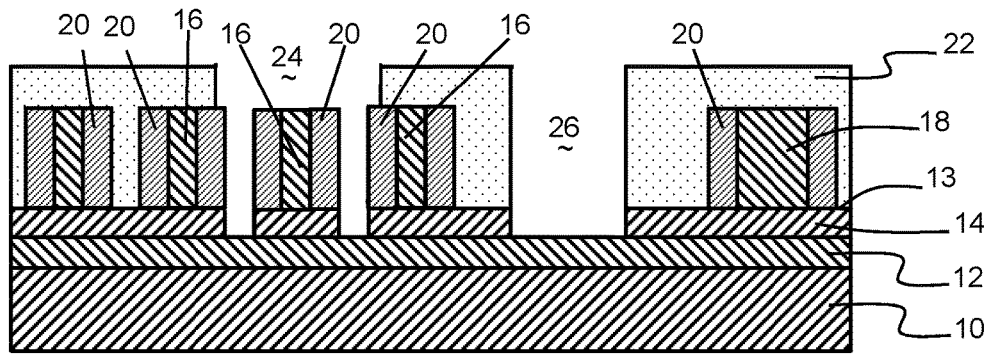

With reference to FIG. 2 in which like reference numerals refer to like features in FIG. 1 and at a subsequent fabrication stage, a sacrificial layer 22 composed of, for example, an organic planarization layer (OPL) material may be applied by spin-coating. The sacrificial layer 22 is patterned to define an opening 24 and an opening 26. The opening 24 in the sacrificial layer 22 exposes some of the mandrels 16 and the sidewall spacers 20 associated with the exposed mandrels 16, as well as areas on the top surface 13 of the dielectric layer 14 horizontally between the sidewall spacers 20. The opening 26 in the sacrificial layer 22 exposes an area on the top surface 13 of the dielectric layer 14 horizontally positioned between the mandrel 18 and the mandrels 16. The area on the top surface 13 of the dielectric layer 14 exposed by opening 26 is featureless in that the exposed area is free of spacers and mandrels.

An etching process is used to remove the material of the dielectric layer 14 in areas that are exposed inside the openings 24, 26 in the sacrificial layer 22. The etching process may remove the material of the dielectric layer 14 selective to the material of the hardmask layer 12, which may operate as an etch stop layer.

Figure 3:
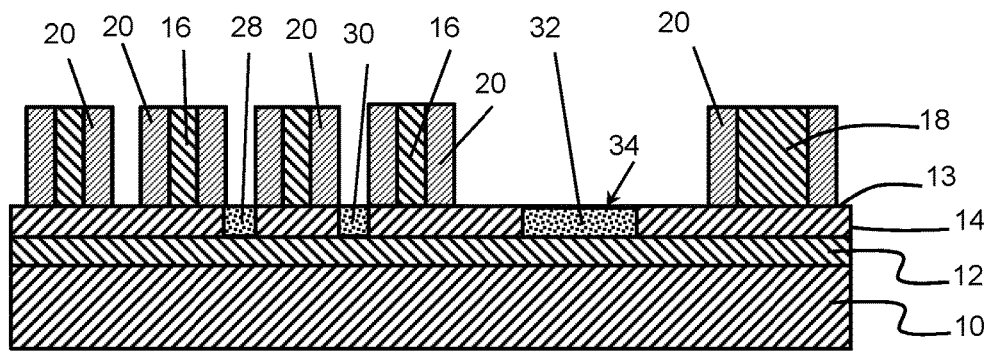

With reference to FIG. 3 in which like reference numerals refer to like features in FIG. 2 and at a subsequent fabrication stage, the sacrificial layer 22 is removed by a cleaning process. Sections 28, 30, 32 of an etch mask layer 34 are formed on respective areas on the top surface of the hardmask layer 12 that are exposed by the removal of the dielectric layer 14 using the patterned sacrificial layer 22 (FIG. 2). The etch mask layer 34 is formed after the sidewall spacers 20 are formed on the mandrels 16, 18, but before the mandrels 16, 18 are pulled. The patterned dielectric layer 14 establishes a template for the formation of the sections 28, 30, 32 of the etch mask layer 34.

The sections 28, 30 of the etch mask layer 34 are located on areas on the top surface of the hardmask layer 12 between sidewall spacers 20 of nearest-neighbor pairs of mandrels 16 and from which the material of the dielectric layer 14 was previously removed. The section 32 of the etch mask layer 34 is located on an area on the top surface of the hardmask layer 12 between the mandrels 16 and the mandrel 18 and from which the material of the dielectric layer 14 was previously removed. In embodiments, the etch mask layer 34 may have a thickness that is less or equal to the thickness of the dielectric layer 14.

The etch mask layer 34 may be composed of a metal deposited by low-temperature CVD or by atomic layer deposition (ALD). In an embodiment, the etch mask layer 34 may be composed of ruthenium (Ru) formed by CVD or ALD using a volatile metal precursor of ruthenium. In an embodiment, the etch mask layer 34 may be composed of cobalt (Co) formed by CVD or ALD using a volatile metal precursor of cobalt. In an embodiment, the etch mask layer 34 may be composed of copper (Cu) formed by electroless plating. The etch mask layer 34 may be selectively deposited such that its material nucleates and forms on the surface of the hardmask layer 12 to form the sections 28, 30, 32, but fails to nucleate and form on the top surfaces of non-metal objects, such as mandrels 16, the dielectric layer 14, and sidewall spacers 20. The selective deposition may be promoted by treating the surface areas of the hardmask layer 12 revealed by the patterning of the overlying dielectric layer 14. The sections 28, 30, 32 of the etch mask layer 34 provide tone inversion during trench lithography for non-mandrel cuts used to determine a pattern for metallization formed in the dielectric layer 10.

Figure 4:
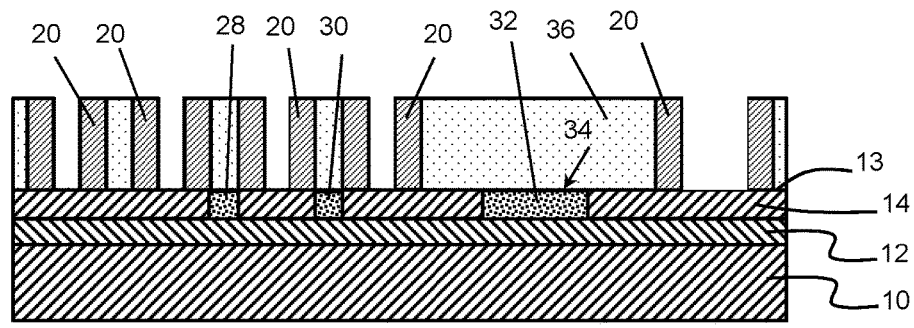

With reference to FIG. 4 in which like reference numerals refer to like features in FIG. 3 and at a subsequent fabrication stage, a sacrificial layer 36 composed of, for example, an organic planarization layer (OPL) material may be applied by spin-coating and etched back to expose the top surfaces of the mandrels 16, 18. The sections 28, 30, 32 of the etch mask layer 34 are buried beneath the sacrificial layer 36. The mandrels 16, 18 are removed selective to the sidewall spacers 20 with an etching process having a suitable etch chemistry. The top surface 13 of the dielectric layer 14 is revealed over areas on the top surface 13 that are exposed when the mandrels 16, 18 are pulled.

Figure 5:
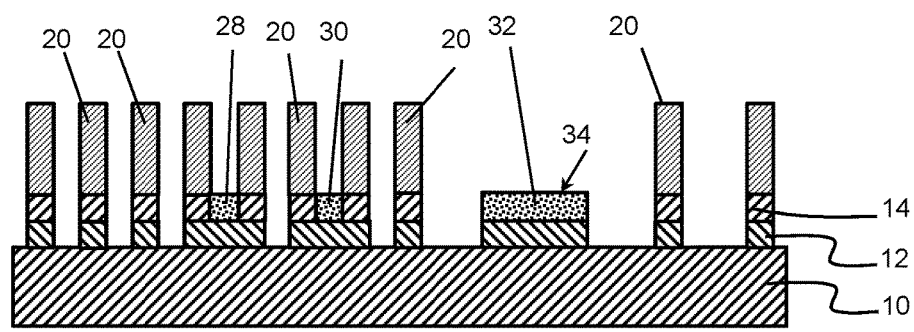
FIG. 5 is a cross-sectional view of the structure at a fabrication stage of the processing method subsequent to FIG. 4.
Figure 6:
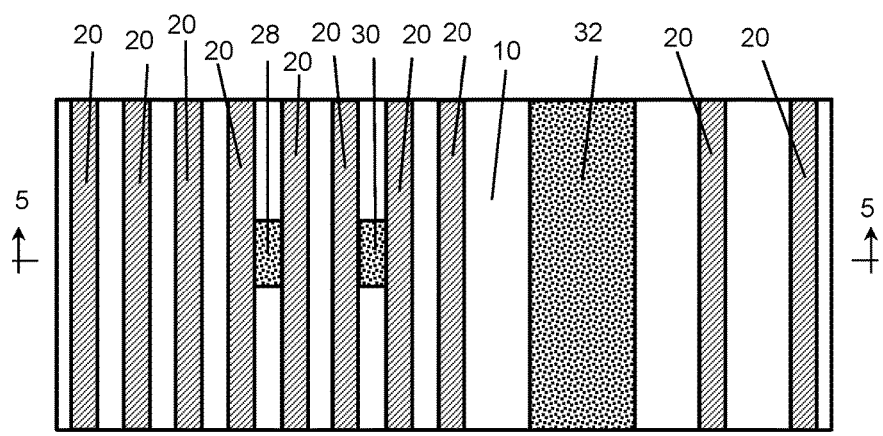
FIG. 6 is a top view of the structure of FIG. 5, which is taken generally along line 5-5 in FIG. 6.

With reference to FIGS. 5 and 6 in which like reference numerals refer to like features in FIG. 4 and at a subsequent fabrication stage, the sacrificial layer 36 is removed by a cleaning process after the mandrels 16, 18 are pulled. The dielectric layer 14 is intact after the sacrificial layer 36 is removed. The dielectric layer 14 is subsequently patterned by an etching process with the sidewall spacers 20 and the sections 28, 30, 32 of the etch mask layer 34 operating as an etch mask. The etching process that opens the dielectric layer 14 may employ an etch chemistry that removes the material of the dielectric layer 14 that is not covered by the hardmask layer 12, sidewall spacers 20, and etch mask layer 34. At the conclusion of the etching process, sections of the dielectric layer 14 are located vertically between the sidewall spacers 20 and the hardmask layer 12. The sections 28, 30, 32 of the etch mask layer 34 are in direct contact with the hardmask layer 12 because the dielectric layer 14 was patterned when forming the etch mask layer 34 in an earlier fabrication stage of the processing method.

The hardmask layer 12 is then patterned by an etching process with the sidewall spacers 20 and the sections 28, 30, 32 of the etch mask layer 34 operating as an etch mask. The etching process may employ an etch chemistry that removes the material of the hardmask layer 12 selective to the materials of the sidewall spacers 20 and the etch mask layer 34, as well as selective to the material of the dielectric layer 10. After the hardmask layer 12 is patterned, the sections of the dielectric layer 14 remain as portions located vertically between the sidewall spacers 20 and the hardmask layer 12.

Sections of the hardmask layer 12 are preserved and retained during its etching in elongated strips over the areas covered by the sidewall spacers 20. Sections of the hardmask layer 12 are likewise preserved and retained during its etching over the areas covered by the sections 28, 30 of the etch mask layer 34. The sections 28, 30 of the etch mask layer 34 and the patterned section of the hardmask layer 12 underlying these sections 28, 30 have equal areas. Each of the sections 28, 30 of the etch mask layer 34 is located between a nearest-neighbor pair of sidewall spacers 20, and the areas covered by sections 28, 30 are bounded in one direction (e.g., width) by these nearest-neighbor sidewall spacers 20. In a direction (e.g., length) that is parallel to the length of the sidewall spacers 20, the sections 28, 30 of the etch mask layer 34 have an arbitrary length that is selected by the dimensions (e.g., length) of the openings 24, 26 in the sacrificial layer 22 (FIG. 3). In an embodiment, the length of the sections 28, 30 of the etch mask layer 34 can be greater than twice the width of the sidewall spacers 20.

The hardmask layer 12 is also preserved and retained during its etching over an area covered by the section 32 of the etch mask layer 34. The section 32 of the etch mask layer 34 and the patterned sections of the hardmask layer 12 have equal areas.

The dielectric layer 10 is subsequently etched to form trenches except for those areas masked by the hardmask layer 12 and protected against removal by etching. Those masked areas on the dielectric layer 10 are determined by the patterning of the hardmask layer 12 based in part on complementary areas covered by the sections 28, 30, 32 of the etch mask layer 34.

Figure 7:
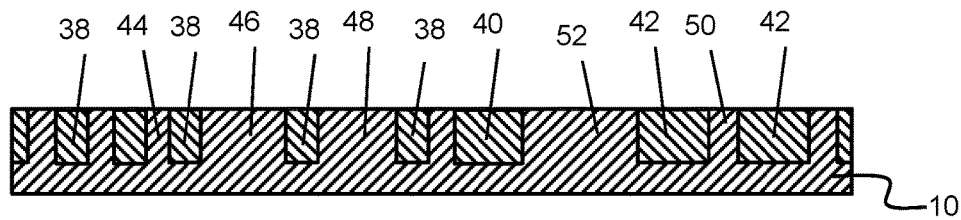
FIG. 7 is a cross-sectional view of the structure at a fabrication stage of the processing method subsequent to FIG. 5.
Figure 8:
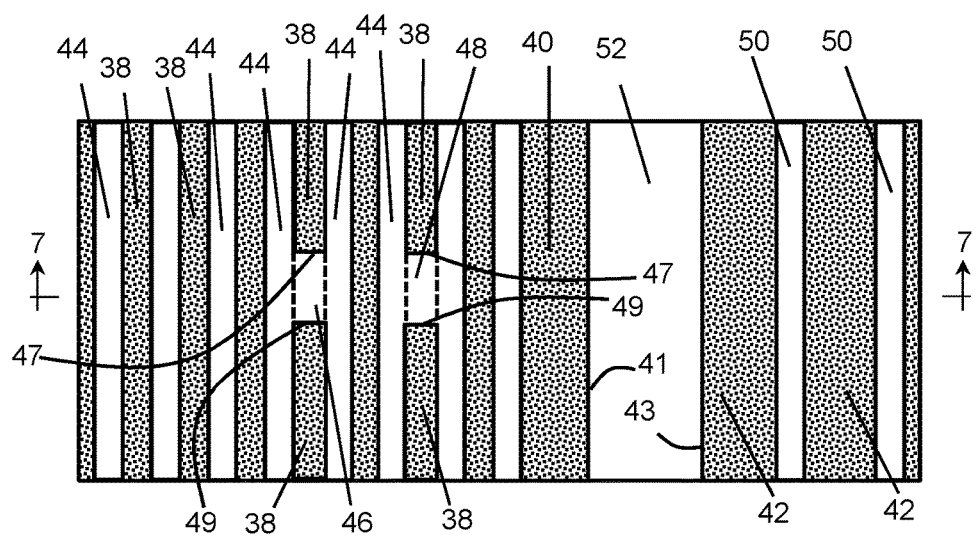
FIG. 8 is a top view of the structure of FIG. 7, which is taken generally along line 7-7 in FIG. 8.

With reference to FIGS. 7 and 8 in which like reference numerals refer to like features in FIGS. 5 and 6 and at a subsequent fabrication stage, the sidewall spacers 20, the sections 28, 30, 32 of the etch mask layer 34, and sections of the dielectric layer 14 beneath the sidewall spacers 20 and beneath the etch mask layer 34 may be removed by one or more etching processes. Specifically, the dielectric layer 10 is etched using the hardmask layer 12 as a patterned etch mask to remove the dielectric layer 10 in unmasked areas and thereby form trenches in the dielectric layer 10. Those masked areas in which the dielectric layer 10 is not etched, and therefore retained, are determined by the areas of the hardmask layer 12 that are covered by the etch mask layer 34 and the sidewall spacers 20 when the hardmask layer 12 is patterned. After the dielectric layer 10 is etched, the hardmask layer 12 may be selectively removed by an etching or cleaning process. In an alternative embodiment, the sidewall spacers 20, the sections 28, 30, 32 of the etch mask layer 34, and the sections of the dielectric layer 14 beneath the sidewall spacers 20 and etch mask layer 34 may be retained on the patterned hardmask layer 12 when the dielectric layer 10 is etched.

The trenches in the dielectric layer 10 are filled with a conductor to form wires 38, 40, 42 of different dimensions. A liner (not shown) comprised of titanium (Ti), titanium nitride (TiN), tantalum (Ta), tantalum nitride (TaN), or a layered combination of these materials (e.g., a bilayer of Ti/TiN) may be applied to the trenches before filling with the metal. The wires 38, 40, 42 may be comprised of a low-resistivity conductor formed using a deposition process, such as a metal like copper (Cu) formed by electroplating or electroless deposition.

The shapes and geometries of the wires 38, 40, 42 reproduce the shapes and geometries of the patterned features in the hardmask layer 12, which are established by the shapes and geometries of the sections 28, 30, 32 of the etch mask layer 34 and the shapes and geometries of the sidewall spacers 20. Adjacent pairs of the wires 38 are separated from each other by strips 44 of the electrical insulator of the dielectric layer 10. When the dielectric layer 10 is etched, these strips 44 are masked by strips of the hardmask layer 12 that are preserved over areas of the hardmask layer 12 masked during its patterning by the sidewall spacers 20.

Adjacent strips 44 are bridged and joined by a section 46 of the electrical insulator of the dielectric layer 10 at the locations of a non-mandrel cut defining a discontinuity in one of the wires 38. Section 46 of the dielectric layer 10 is masked and retained at the area of the patterned hardmask layer 12 masked during its patterning by the section 28 of the etch mask layer 34. Adjacent strips 44 are bridged and joined by a section 48 of the electrical insulator of the dielectric layer 10 at the locations of a non-mandrel cut defining a discontinuity in another of the wires 38. Section 48 of the dielectric layer 10 is masked and retained at the area of the hardmask layer 12 masked during its patterning by the section 30 of the etch mask layer 34.

The linearly-aligned wires 38 that are interrupted by the section 46 of the dielectric layer 10 have respective tips or ends 47, 49 that are separated by the section 46 of dielectric layer 10 and that have a tip-to-tip arrangement. The linearly-aligned wires 38 that are interrupted by the section 48 of the dielectric layer 10 likewise have respective tips or ends 47, 49 that are separated by the section 48 of dielectric layer 10 and that have a tip-to-tip arrangement. The sections 46, 48 are comprised of the dielectric material of the dielectric layer 10 and have dimensions (e.g., length and width) equal to the dimensions of the sections 28, 30 of the etch mask layer 34 (FIG. 5).

The wires 42 are wider than wires 38, and may function as, for example, pad layers. Adjacent pairs of the wires 42 are separated from each other by strips 50 of the electrical insulator of the dielectric layer 10. When the dielectric layer 10 is etched, these strips 50 are masked by strips of the hardmask layer 12 preserved over areas of the hardmask layer 12 masked during its patterning by the sidewall spacers 20.

The wire 40, which is also wider than the wires 38, is located between the wires 38 and the wires 42. Wire 40 has a side edge 41 that is separated from a side edge 43 of the nearest wire 42 by a strip 52 of the electrical insulator of the dielectric layer 10. When the dielectric layer 10 is etched, this strip 52 is masked by a strip of the hardmask layer 12 over an area of the hardmask layer 12 masked during its patterning by the section 32 of the etch mask layer 34. The dimensions of the section 32 of the etch mask layer 34 (FIG. 5) determine the lateral spacing between the side edge 41 of wire 40 and the side edge 43 of the wire 42 that is adjacent to wire 40.

Figure 9:
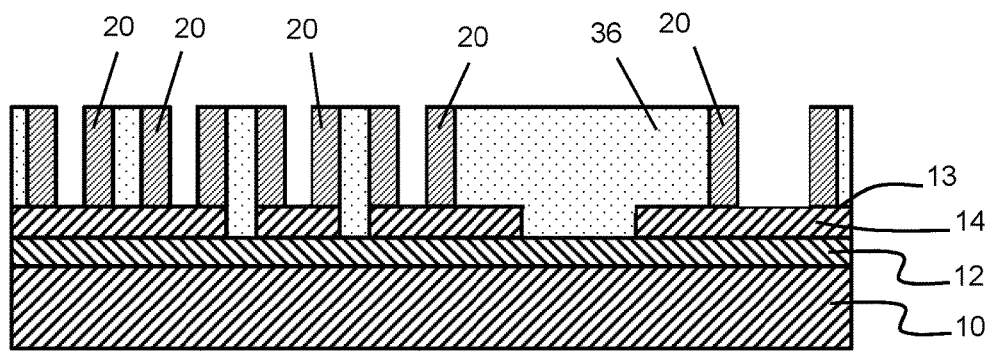
FIG. 9 is a cross-sectional view at a fabrication stage of a processing method in accordance with embodiments of the invention.

With reference to FIG. 9 in which like reference numerals refer to like features in FIG. 2 and in accordance with embodiments of the invention, the process flow may be adjusted to remove the mandrels 16, 18 before forming the sections 28, 30, 32 of the etch mask layer 34. To that end, the sacrificial layer 22 is stripped by a cleaning process, and the sacrificial layer 36 is applied by spin-coating and etched back to expose the top surfaces of the mandrels 16, 18. The mandrels 16, 18 are removed selective to the sidewall spacers 20 with an etching process having a suitable etch chemistry. The top surface 13 of the dielectric layer 14 is exposed over areas from which the mandrels 16, 18 are pulled.

After the mandrels 16, 18 are pulled, the sacrificial layer 36 is stripped by a cleaning process. As described in the context of FIG. 3, the sections 28, 30, 32 of the etch mask layer 34 are formed on respective areas on the top surface of the hardmask layer 12 at locations exposed by the removal of the dielectric layer 14 from the hardmask layer 12. The etch mask layer 34 is formed after the sidewall spacers 20 are formed on the mandrels 16, 18, and after the mandrels 16, 18 are pulled. The process then continues as described in connection with FIGS. 5 and 6 culminating with the formation of the wires 38, 40, 42 by filling the trenches in dielectric layer 10 with conductor, as described in the context of FIGS. 7 and 8.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first dielectric layer on a metal hardmask layer;
   forming a first mandrel and a second mandrel on the first dielectric layer;
   forming a patterned sacrificial layer on the first dielectric layer;
   etching the first dielectric layer to form a non-mandrel cut in the first dielectric layer that is vertically aligned with an opening in the patterned sacrificial layer;
   forming a metal layer on an area of the metal hardmask layer exposed by the non-mandrel cut in the first dielectric layer; and
   patterning the metal hardmask layer with the metal layer masking the metal hardmask layer over the area.

2. The method of claim 1 further comprising:
   forming a first sidewall spacer on the first dielectric layer adjacent to the first mandrel; and
   forming a second sidewall spacer on the first dielectric layer adjacent to the second mandrel,
   wherein the area is located between the first sidewall spacer and the second sidewall spacer.

3. The method of claim 2 wherein, when the metal hardmask layer is patterned, the first sidewall spacer and the second sidewall spacer mask the metal hardmask layer, a first section of the first dielectric layer is located vertically between the first sidewall spacer and the metal hardmask layer, and a second section of the first dielectric layer is located vertically between the second sidewall spacer and the metal hardmask layer.

4. The method of claim 2 further comprising:
   removing the first mandrel selective to the first sidewall spacer; and
   removing the second mandrel selective to the second sidewall spacer,
   wherein the metal layer is deposited after the first mandrel and the second mandrel are removed.

5. The method of claim 4 wherein the non-mandrel cut is formed in the first dielectric layer before the first mandrel and the second mandrel are removed.

6. The method of claim 4 wherein the first dielectric layer is revealed at a first location revealed by the removal of the first mandrel and at a second location revealed by the removal of the second mandrel further comprising:
   removing the first dielectric layer from the first location and the second location.

7. The method of claim 6 wherein the metal hardmask layer is patterned after the first dielectric layer is removed from the first location and the second location.

8. The method of claim 2 further comprising:
   removing the first mandrel selective to the first sidewall spacer; and
   removing the second mandrel selective to the second sidewall spacer,
   wherein the metal layer is deposited before the first mandrel and the second mandrel are removed.

9. The method of claim 8 wherein the non-mandrel cut is formed in the first dielectric layer before the first mandrel and the second mandrel are removed.

10. The method of claim 8 wherein the first mandrel and the second mandrel are removed by an etching process, and the metal layer is masked by an etch mask when the first mandrel and the second mandrel are removed.

11. The method of claim 8 further comprising:
    removing the first dielectric layer at a first location revealed by the removal of the first mandrel and at a second location revealed by the removal of the second mandrel.

12. The method of claim 11 wherein the metal hardmask layer is patterned after the first dielectric layer is removed at the first location revealed by the removal of the first mandrel and at the second location revealed by the removal of the second mandrel.

13. The method of claim 2 wherein the first dielectric layer and the metal hardmask layer are formed as a layer stack on a second dielectric layer, and further comprising:
    removing the first mandrel selective to the first sidewall spacer; and
    removing the second mandrel selective to the second sidewall spacer,
    after the metal hardmask layer is patterned, etching the second dielectric layer to form a trench between the first sidewall spacer and the second sidewall spacer,
    wherein a section of the second dielectric layer is masked during etching by the area of the metal hardmask layer to transfer the non-mandrel cut to the second dielectric layer.

14. The method of claim 13 further comprising:
    filling the trench with a conductor layer to form a first wire having an end and a second wire having an end separated from the end of the first wire by the section of the second dielectric layer.

15. The method of claim 2 wherein forming the metal layer on the area of the metal hardmask layer exposed by the non-mandrel cut in the first dielectric layer comprises:
   selectively depositing the metal layer on the area of the metal hardmask layer.

16. The method of claim 1 wherein the metal layer is comprised of ruthenium, copper, or cobalt.

17. The method of claim 1 wherein forming the metal layer on the area of the metal hardmask layer exposed by the non-mandrel cut in the first dielectric layer comprises:
   selectively depositing the metal layer on the area of the metal hardmask layer.

18. The method of claim 17 wherein the metal layer is selectively deposited by atomic layer deposition, electroless deposition, or chemical vapor deposition.

19. The method of claim 1 wherein the patterned sacrificial layer is removed before the metal layer is formed on the area of the metal hardmask layer exposed by the non-mandrel cut in the first dielectric layer.

\* \* \* \* \*